United States Patent
Kubota

(10) Patent No.: US 7,336,687 B2
(45) Date of Patent: Feb. 26, 2008

(54) PROVIDING A SUITABLE OUTPUT CURRENT TO A LASER DIODE

(75) Inventor: Shinichi Kubota, Oheaka (JP)

(73) Assignee: Ricoh Company, Ltd., Tokyo (JP)

( * ) Notice: Subject to any disclaimer, the term of this patent is extended or adjusted under 35 U.S.C. 154(b) by 402 days.

(21) Appl. No.: 11/069,722

(22) Filed: Mar. 1, 2005

(65) Prior Publication Data
US 2005/0195869 A1 Sep. 8, 2005

(30) Foreign Application Priority Data
Mar. 3, 2004 (JP) .............................. 2004-058970

(51) Int. Cl.
*H01S 3/00* (2006.01)
(52) U.S. Cl. ................. 372/38.02; 372/38.07
(58) Field of Classification Search ............. 372/38.02, 372/38.07
See application file for complete search history.

(56) References Cited

U.S. PATENT DOCUMENTS 5,315,606 A * 5/1994 Tanaka ..................... 372/38.02

FOREIGN PATENT DOCUMENTS

| JP | 4-359482 | 12/1992 |
| JP | 5-344293 | 12/1993 |
| JP | 3130825 | 11/2000 |

* cited by examiner

Primary Examiner—Armando Rodriguez
(74) Attorney, Agent, or Firm—Coper & Dunham LLP

(57) ABSTRACT

A laser diode driving circuit capable of providing a suitable output current to a laser diode is disclosed. The laser diode driving circuit includes a current supply, a first pseudo laser diode, a second pseudo laser diode, and an output current mirror circuit. An input current provided by the current supply is output through the output current mirror circuit to the laser diode. By making the characteristic of each of the first and second pseudo laser diodes substantially equal to the characteristic of the laser diode, the non-linearity between the input current and the output current is compensated.

43 Claims, 13 Drawing Sheets

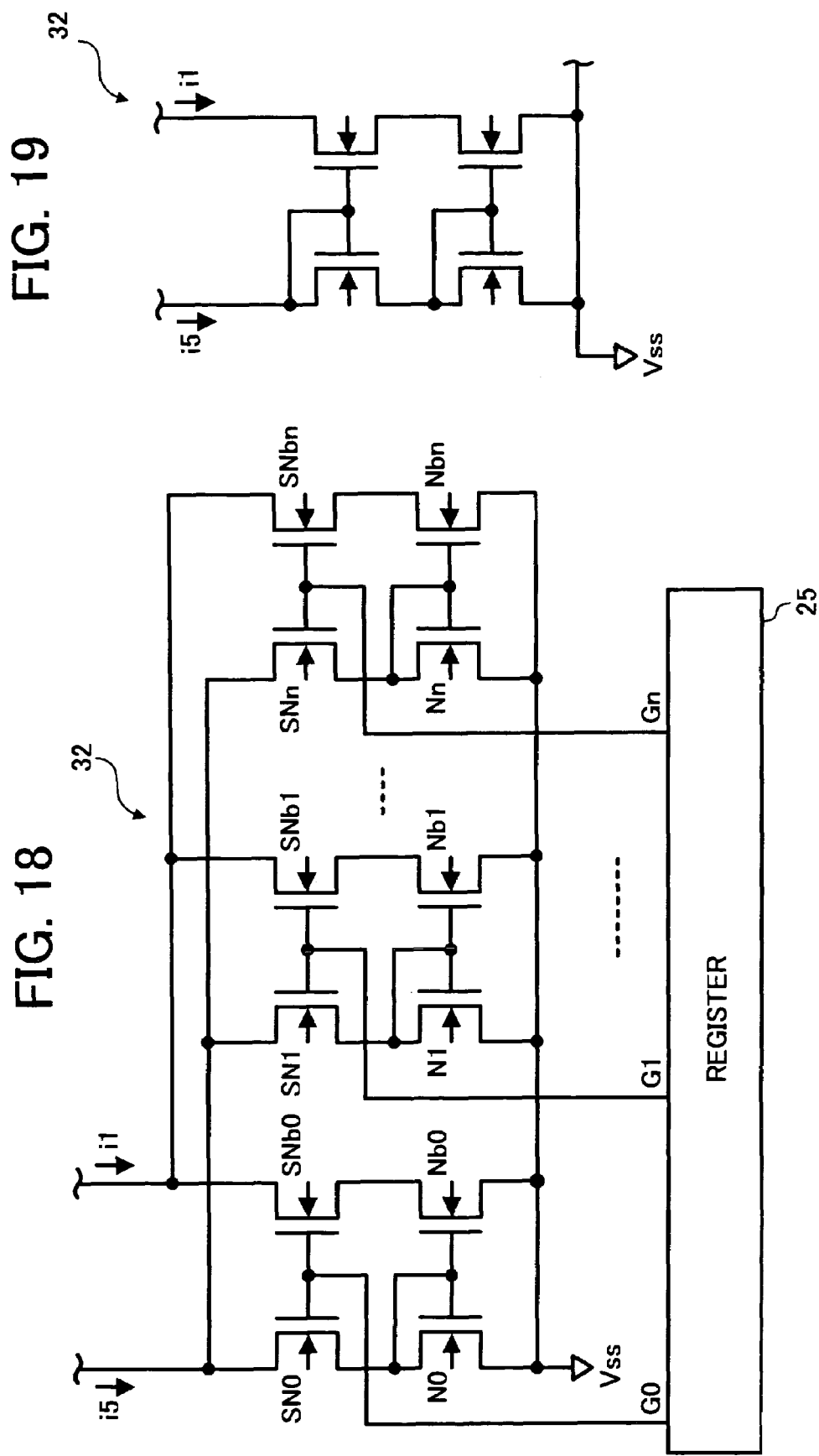

PROVIDING A SUITABLE OUTPUT CURRENT TO A LASER DIODE

FIELD

The present invention relates to a laser diode driving circuit, and more particularly, to a laser diode driving circuit capable of providing a suitable output current to a laser diode.

BACKGROUND

A laser diode is used as a light source for various apparatus, including an image forming apparatus, an optical disc apparatus, and a communication apparatus, for example. The laser diode is controlled by a current output from a laser diode driving circuit 100 of FIG. 1, for example.

The background circuit 100 of FIG. 1, which drives a laser diode LD, includes a current supply 101, a first current mirror circuit 104, a second current mirror circuit 107, and a switch 108. As shown in FIG. 1, the first current mirror circuit 104 includes a pair of N-channel metal oxide semiconductor field effect transistors ("NMOS transistors") 102 and 103. The second current mirror circuit 107 includes a pair of P-channel metal oxide semiconductor field effect transistors ("PMOS transistors") 105 and 106.

An input current ia, provided by the current supply 101, is input to the first and second current mirror circuits 104 and 107, and output as an output current iLD to drive the laser diode LD.

Ideally, the output current iLD is proportional to the input current ia. However, in most cases, the input current ia and the output current iLD are not proportional to each other, depending on various factors including the channel length modulation effect, fluctuations in voltage, and variations in characteristic of the laser diode LD, etc. Accordingly, referring to FIG. 2, the characteristic of the background circuit 100, defined by the ratio between the output current iLD and the input current ia, is not always linear as indicated by an observed characteristic curve Lc, as opposed to an expected characteristic curve Lt.

SUMMARY OF THE INVENTION

Exemplary embodiments of the present disclosure include a laser diode driving circuit capable of providing a suitable output current to a laser diode.

In one exemplary embodiment, the laser driving circuit includes a current supply, a first pseudo laser diode, a second pseudo laser diode, and an output current mirror circuit. The current supply inputs an input current. The first pseudo laser diode receives a first current substantially equal or proportional to the input current. The second pseudo laser diode receives a second current substantially equal to the first current. The output current mirror circuit generates an output current substantially equal or proportional to at least one of the first current and the second current, and provides the output current to the laser diode. In this exemplary embodiment, to achieve the linearity between the input current and the output current, the characteristic of each of the first pseudo laser diode and the second pseudo laser diode is made substantially equal to the characteristic of the laser diode.

For example, the characteristic of each of the first and second pseudo laser diodes may be determined based on at least one of a forward voltage and a resistance of the laser diode.

BRIEF DESCRIPTION OF THE DRAWINGS

A more complete appreciation of the disclosure and many of the attendant advantages thereof will be understood more readily by reference to the following detailed description when considered in connection with the accompanying drawings, wherein:

FIG. 18 is a schematic diagram illustrating the fifth current mirror circuit of FIG. 17, according to a preferred embodiment;

FIG. 19 is a schematic diagram illustrating a part of the fifth current mirror circuit of FIG. 17, according to another preferred embodiment;

DETAILED DESCRIPTION OF PREFERRED EMBODIMENTS

Figure 1:
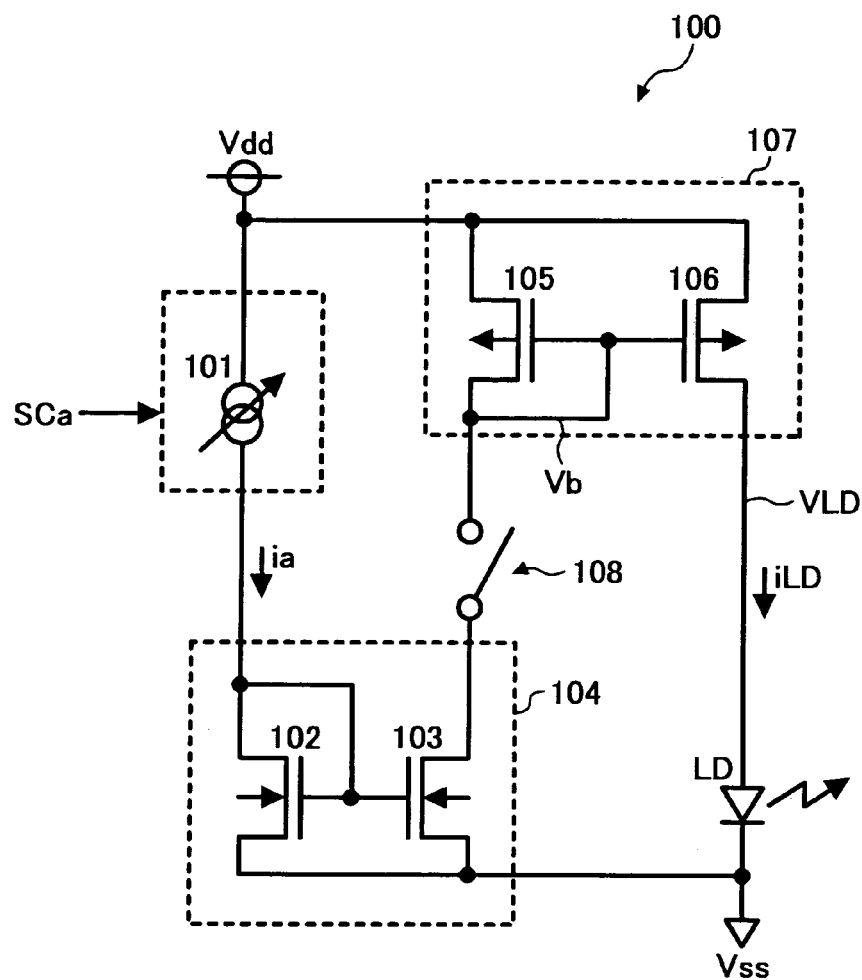
FIG. 1 is a schematic diagram illustrating a circuit configuration of a background laser diode driving circuit.
Figure 2:
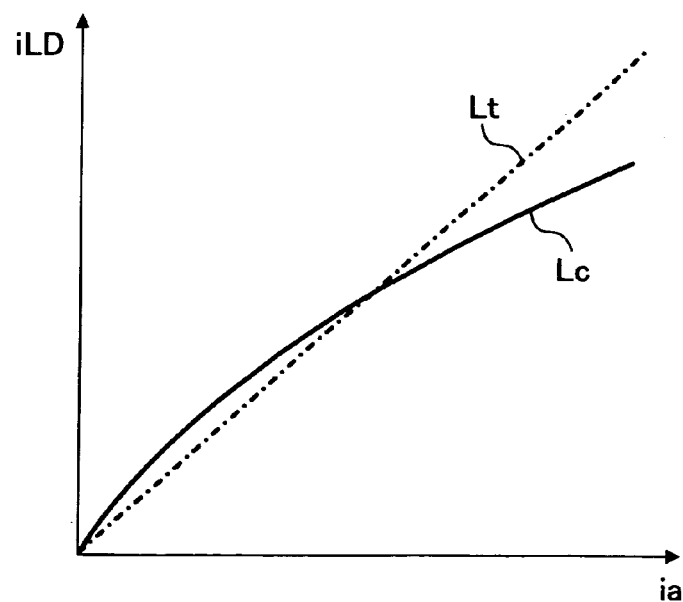
FIG. 2 is a graph showing the relationship between an input current and an output current of the circuit of FIG. 1.

In describing preferred embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner. Referring now to the drawings, wherein like reference numerals designate identical or corresponding parts throughout the several views, particularly to FIG. 3, a description is made of a laser diode driving circuit 1 according to a preferred embodiment.

The driving circuit 1, capable of driving a laser diode LD, includes a first pseudo laser diode LD1, a second pseudo laser diode LD2, a current supply 2, a first current mirror circuit 3, a second current mirror circuit 4, a third current mirror circuit 5, a fourth current mirror circuit 6, an NMOS transistor N5, an NMOS transistor N6, an amplifier AMP, a first switch SWa, and a second switch SWb.

Figure 3:
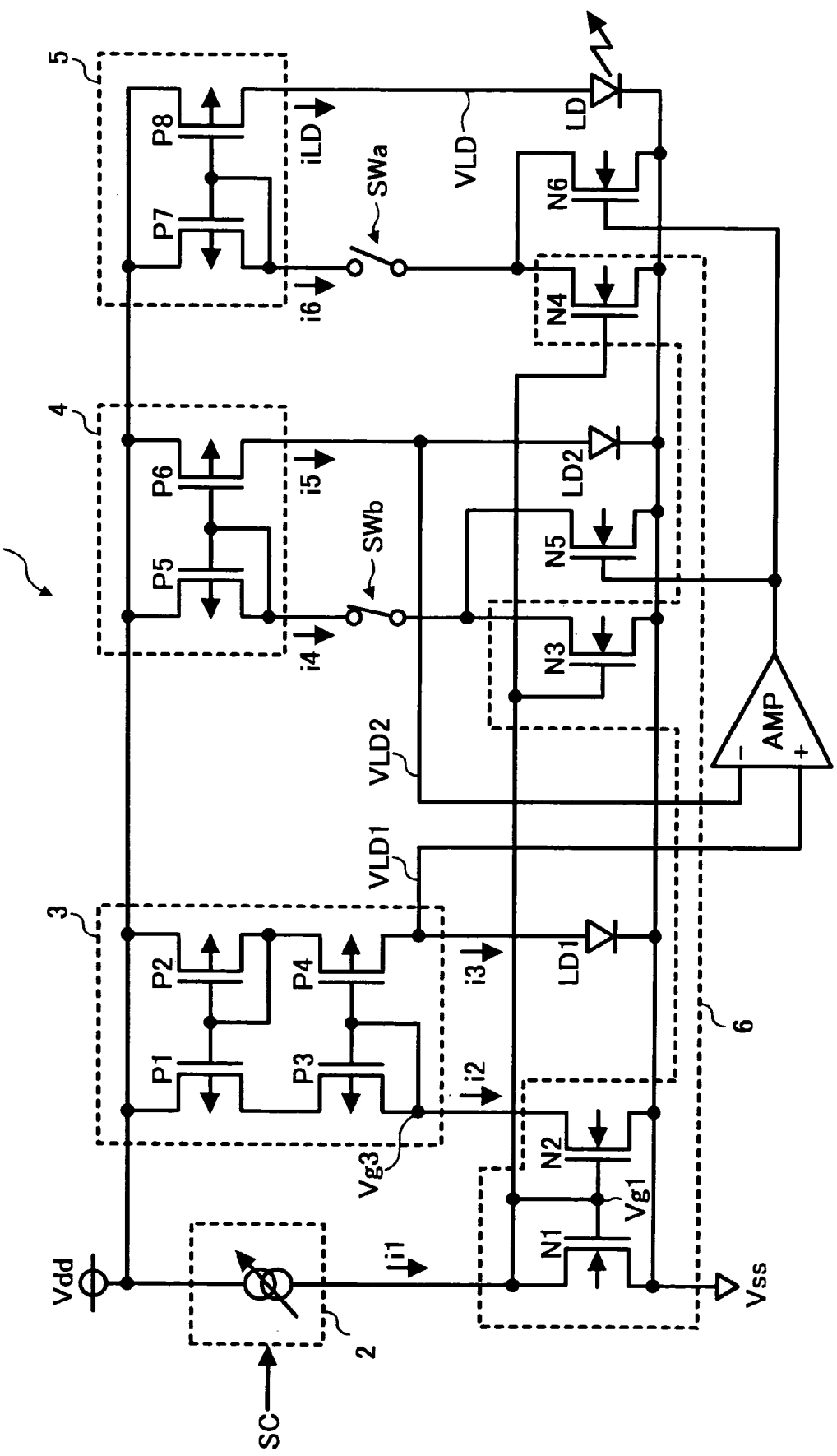
FIG. 3 is a schematic diagram illustrating a circuit configuration of a laser diode driving circuit according to a preferred embodiment.

As shown in FIG. 3, the current supply 2 and an NMOS transistor N1 of the fourth current mirror circuit 6 are serially connected between a positive supply voltage Vdd and a negative supply voltage Vss. The current supply 2 outputs an input current i1 according to a control signal SC received from the outside.

The fourth current mirror circuit 6 includes parallel-connected NMOS transistors N2 to N4 in addition to the NMOS transistor N1. The NMOS transistor N2 provides a current i2 to the first current mirror circuit 3. The NMOS transistor N3 provides a current i4 to the second current mirror circuit 4. The NMOS transistor N4 provides a current i6 to the third current mirror circuits 5. The gate and the drain of the NMOS transistor N1 are connected to each other. The gate of the NMOS transistor N1 is further connected to each of the gates of the NMOS transistors N2, N3, and N4. Each of the sources of the NMOS transistors N1, N2, N3, and N4 is connected to the negative supply voltage Vss.

The first current mirror circuit 3 includes PMOS transistors P1 to P4, and provides a current i3 to the first pseudo laser diode LD1. The PMOS transistors Pi and P3 are serially connected between the positive supply voltage Vdd and the gate of the NMOS transistor N2. The PMOS transistors P2 and P4 are serially connected between the positive supply voltage Vdd and the anode of the first pseudo laser diode LD1. The PMOS transistor P2 has the gate connected to the gate of the PMOS transistor P1, and the drain connected to the connecting point of the PMOS transistors P1 and P2. The PMOS transistor P3 has the gate connected to the gate of the PMOS transistor P4, and the drain connected to the connecting point of the PMOS transistors P3 and P4.

The second current mirror circuit 4 includes PMOS transistors P5 and P6, and provides a current i5 to the second pseudo laser diode LD2. The sources of the PMOS transistors P5 and P6 are each connected to the positive supply voltage Vdd. The gates of the PMOS transistors P5 and P6 are connected to each other. The drain of the PMOS transistor P5 is connected to the connecting point of the PMOS transistors P5 and P6. The second switch SWb and the NMOS transistor N3 are serially connected between the drain of the PMOS transistor P5 and the negative supply voltage Vss. The second pseudo laser diode LD2 is connected between the drain of the PMOS transistor P6 and the negative supply voltage Vss.

The third current mirror circuit 5 includes PMOS transistors P7 and P8, and provides an output current iLD to the laser diode LD. The sources of the PMOS transistors P7 and P8 are each connected to the positive supply voltage Vdd. The gates of the PMOS transistors P7 and P8 are connected to each other. The drain of the PMOS transistor P7 is connected to the connecting point of the PMOS transistors P7 and P8. The first switch SWa and the NMOS transistor N4 are serially connected between the drain of the PMOS transistor P7 and the negative supply voltage Vss. The laser diode LD is connected between the drain of the PMOS transistor P8 and the negative supply voltage Vss.

The amplifier AMP controls an operation of the NOMS transistors N5 and N6. The positive input terminal of the amplifier AMP is connected to the connecting point at which the drain of the PMOS transistor P4 and the anode of the first pseudo laser diode LD1 are connected. The negative input terminal of the amplifier AMP is connected to the connecting point at which the drain of the PMOS transistor P6 and the anode of the second pseudo laser diode LD2 are connected. The output terminal of the amplifier AMP is connected to the gates of the NMOS transistors N5 and N6, respectively. The NMOS transistor N5 is connected in parallel to the NMOS transistor N3. The NMOS transistor N6 is connected in parallel to the NMOS transistor N4.

The first switch SWa controls on or off of the laser diode LD. The second switch SWb, which is regularly turned on, adjusts the impedance Z1 of the first switch SWa, when the first switch SWa is turned on. Preferably, the impedance Z1 is adjusted to be smaller than the impedance Z2 of the second switch SWb.

The second current mirror circuit 4 preferably has a transistor element size smaller than that of the third current mirror circuit 5. Accordingly, the current consumption M2$i$ of the circuit 4 is less than the current consumption M3$i$ of the circuit 5.

Further, the transistor sizes of the circuits 4 and are preferably set such that the ratio between the current i5 and the current iLD is substantially equal to the ratio between the current consumption M2$i$ and the current consumption M3$i$. In such a case, the ratio between the anode-current/anode-voltage characteristic (hereinafter, simply referred to as the "characteristic") of the second pseudo laser diode LD2 and the characteristic of the laser diode LD is substantially equal to the ratio between the current consumption M2$i$ and the current consumption M3$i$, as indicated by the equation: (i5/VLD2)/(iLD/VLD)=M2$i$/M3$i$.

Furthermore, the ratio between the impedance Z1 of the first switch SWa and the impedance Z2 of the second switch SWb is, preferably, substantially equal to the inverse of the ratio between the current consumption M2$i$ and the current consumption M3$i$, as indicated by the equation: Z2/Z1=M3$i$/M2$i$.

As shown in FIG. 3, the first current mirror circuit 3 includes two current mirror circuits stacked vertically, to compensate the channel length modulation effect. However, any kind of circuits, capable of compensating the channel length modulation effect, may be used, including a cascode current mirror circuit or a Wilson current mirror circuit, for example.

As described above, the current i1, supplied by the current supply 2, is input to the drain of the NMOS transistor N1 as a drain current. The drain current is input to the first current mirror circuit 3 through the NMOS transistor N2 as the current i2. The current i2 is further supplied to the first pseudo laser diode LD1 as the current i3.

Similarly, the drain current is further input to the second current mirror circuit 4 through the NMOS transistor N3, as the current i4. The current i4 is further supplied to the second pseudo laser diode LD2 as the current i5.

The NMOS transistor N2 has an element size larger than that of the NMOS transistor N3. Accordingly, the current i2 (i.e. the drain current of the NMOS transistor N2) is larger than the current i4 (i.e. the drain current of the NMOS transistor N3). As a result, the current i3 (i.e. the anode current of the first pseudo laser diode LD1) becomes larger than the current i5. Assuming that the characteristics of the first and second pseudo laser diodes LD1 and LD2 are substantially equal to each other, the anode voltage VLD1 of the first pseudo laser diode LD1 becomes larger than the anode voltage VLD2 of the second pseudo laser diode LD2.

As shown in FIG. 3, the anode voltage VLD1 is input to the positive input terminal of the amplifier AMP. The anode voltage VLD2 is input to the negative input terminal of the amplifier AMP. The amplifier AMP, which controls the gate voltage of the NMOS transistor N5, can control the amount of the current i4, and thus, the amount of the current i5. In this way, the anode voltage VLD1 and the anode voltage VLD2 are made substantially equal to each other.

The amplifier AMP, which controls the gate voltage of the NMOS transistor N6, may also control the amount of the current i6, and thus, the amount of the current iLD. Preferably, the current i6 is set such that the ratio in drain current between the NMOS transistor N5 and the NMOS transistor N6 is substantially equal to the ratio between the current consumption M2i and the current consumption M3i. In this way, the current iLD becomes substantially proportional to the current i5.

Since the current i5 is substantially equal to the current i3, and the current i3 is substantially proportional to the current i1, the output current iLD is substantially proportional to the input current i1.

Figure 4:
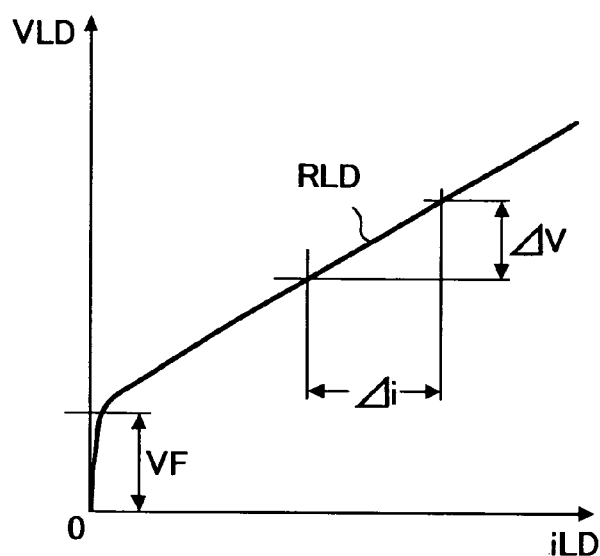
FIG. 4 is a graph showing the relationship between a current and a voltage of a laser diode of FIG. 3.

In this exemplary case, each of the characteristics of the first and second pseudo laser diodes LD1 and LD2 is substantially equal to the characteristic of the laser diode LD. Referring to FIG. 4, the characteristic of the laser diode LD may be determined based on a forward voltage VF and a resistance RLD (indicated as the slope V/i). The forward voltage VF or the resistance RLD varies for each laser diode, depending on manufacturing conditions of the laser diode or environmental factors affecting the laser diode, for example.

Figure 5:
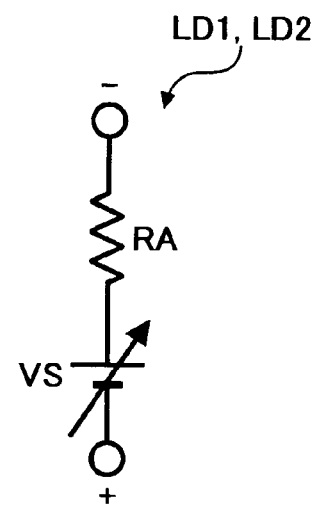
FIG. 5 is a schematic diagram illustrating a circuit configuration of any one of the first and second pseudo laser diodes of FIG. 3, according to a preferred embodiment.

In order to respond to variations in the characteristics of the laser diode LD, each of the first and second pseudo laser diodes LD1 and LD2 (collectively, referred to as the "pseudo laser diode") may have a configuration illustrated in FIG. 5, according to a preferred embodiment.

The pseudo laser diode of FIG. 5 includes a resistor circuit RA and a voltage supply VS. One terminal of the resistor circuit RA is connected to the positive electrode of the voltage supply VS, while the other terminal of the resistor circuit RA functions as the anode of the pseudo laser diode. The negative electrode of the voltage supply VS functions as the cathode of the pseudo laser diode.

Figure 6:
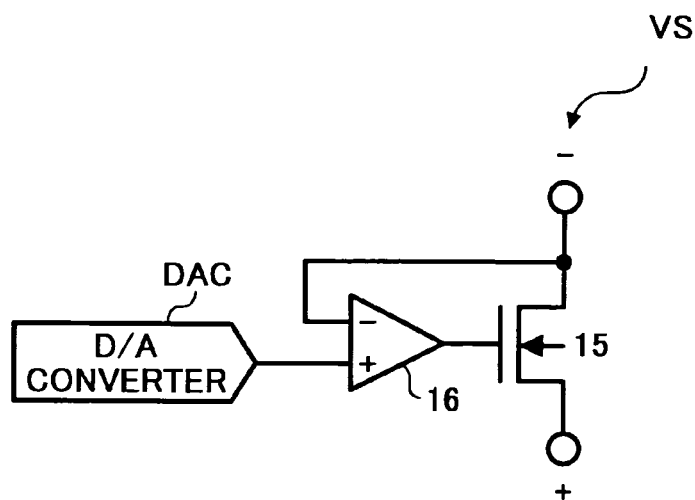
FIG. 6 is a schematic diagram illustrating a circuit configuration of a voltage supply of FIG. 5.

The voltage supply VS may change an amount of supply voltage, corresponding to the characteristic of the laser diode LD. Referring to FIG. 6, the voltage supply VS includes an NMOS transistor 15, an amplifier 16, and a D/A (digital/analog) converter DAC. The positive input terminal of the amplifier 16 is connected to the D/A converter DAC. The output terminal of the amplifier 16 is connected to the gate of the NMOS transistor 15. The drain of the NMOS transistor 15 functions as the positive electrode of the voltage supply VS, while the source of the NMOS transistor 15 functions as the negative electrode of the voltage supply VS. The voltage of the voltage supply VS may be changed by changing the output voltage of the D/A converter DAC.

Figure 7:
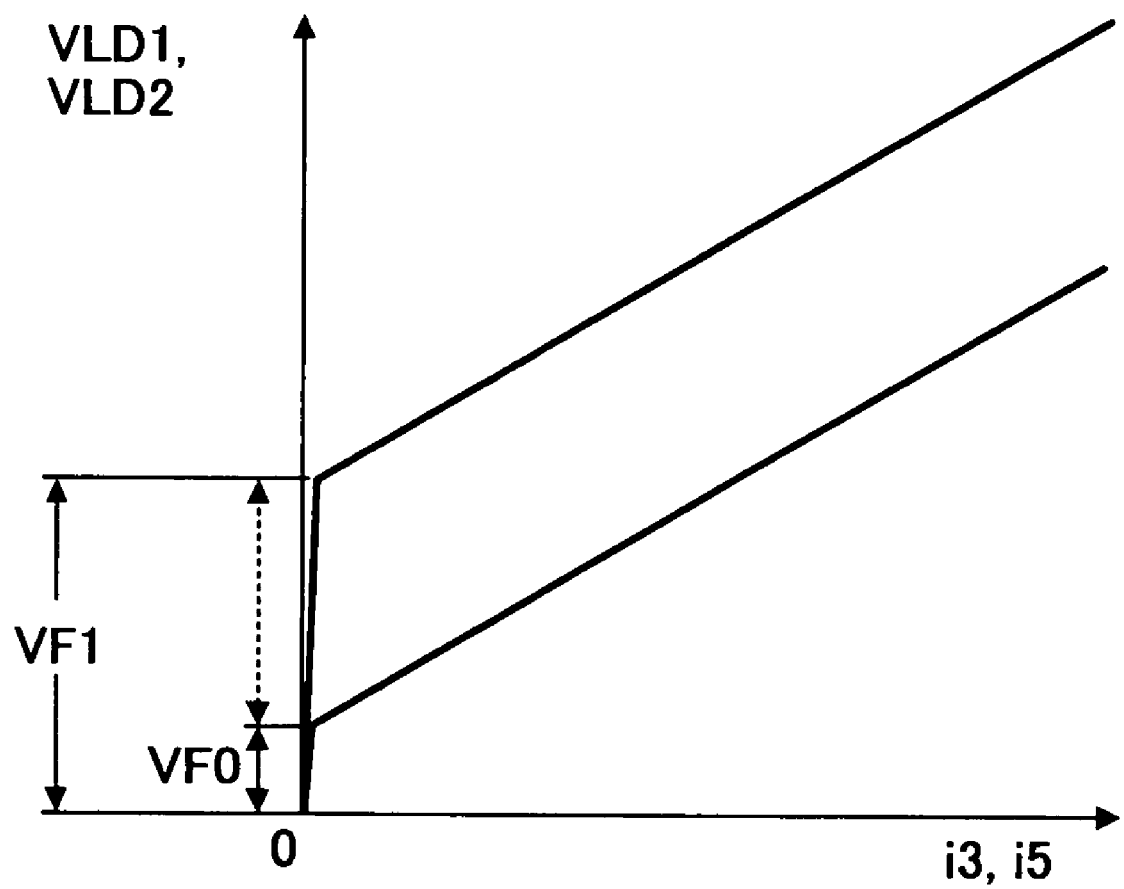
FIG. 7 is a graph showing the relationship between a voltage and a current of any one of the first and second pseudo laser diodes of FIG. 3, according to a preferred embodiment.

If the voltage of the voltage supply VS can be freely changed in the above-described manner, the forward voltage of the pseudo laser diode can be changed accordingly, for example, from VF0 to VF1 as illustrated in FIG. 7, depending on the forward voltage VF of the laser diode LD shown in FIG. 4.

In another example, the resistor circuit RA may be changed to have a different amount of resistance, corresponding to the resistance RLD of the laser diode LD.

Figure 8:
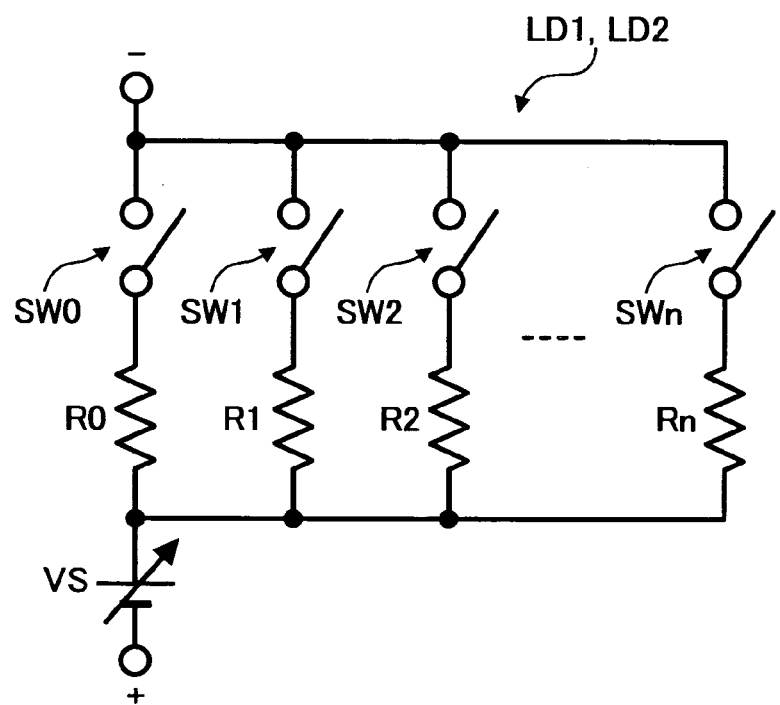
FIG. 8 is a schematic diagram illustrating a circuit configuration of any one of the first and second pseudo laser diodes of FIG. 3, according to another preferred embodiment.

In order to change resistance, the pseudo laser diode may have a configuration illustrated in FIG. 8, for example. The pseudo laser diode of FIG. 8 includes a plurality of resistors R0 to Rn with n being an integer greater than 1, a plurality of switches SW0 to SWn, and the voltage supply VS. The terminals of the resistors RØ to Rn are connected to the voltage supply VS, while the other terminals of the resistors R to Rn are connected to the terminals of the corresponding switches SW0 to SWn. The other terminals of the switches SW0 to SWn function as the anode of the pseudo laser diode. The amount of resistance may be controlled by turning on or off at least one of the switches SW1 to SWn.

Figure 9:
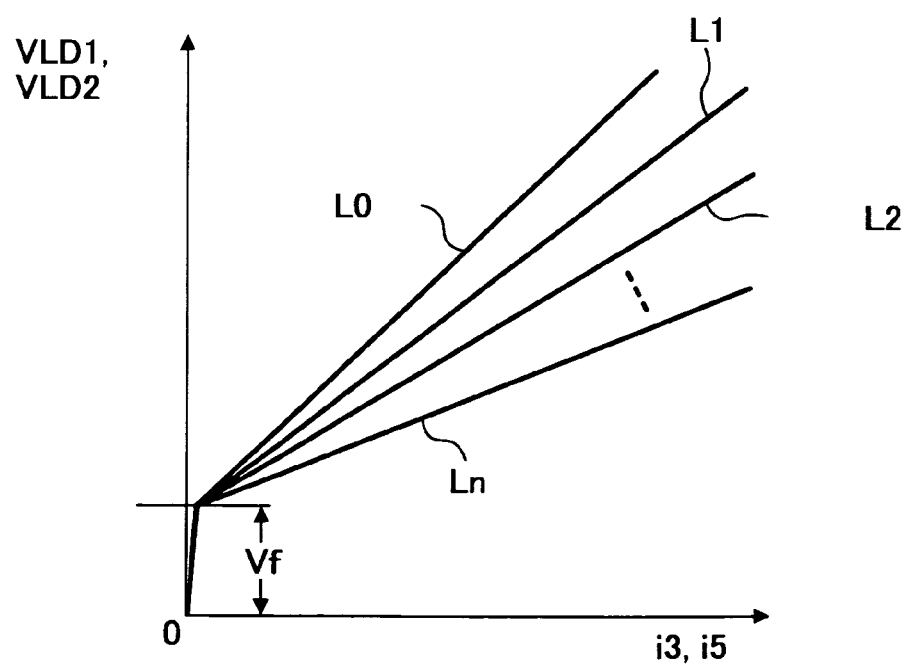
FIG. 9 is a graph showing the relationship between a voltage and a current of any one of the first and second pseudo laser diodes of FIG. 3, according to another preferred embodiment.

The resistance values of the resistors RØ to Rn may be equal to one another, or they may be different from one another. For example, when the resistance values of the resistors RØ to Rn are previously determined such that the resistance value ratios for the resistors R0 to Rn are $1:1:\frac{1}{2} \ldots \frac{1}{2}^{n-1}$, a wide range of resistance values may be obtained for the pseudo laser diode by controlling the switches SW0 to SWn. Referring to FIG. 9, when the switch SW0 is turned on, the resistance defined by the line L0 is obtained. When the switches SW0 and SW1 are turned on, the resistance defined by the line L1 is obtained. When the switches SW0 to SW2 are turned on, the resistance defined by the line L2 is obtained. When the switches SW0 to SWn are turned on, the resistance defined by the line Ln is obtained.

Figure 10:
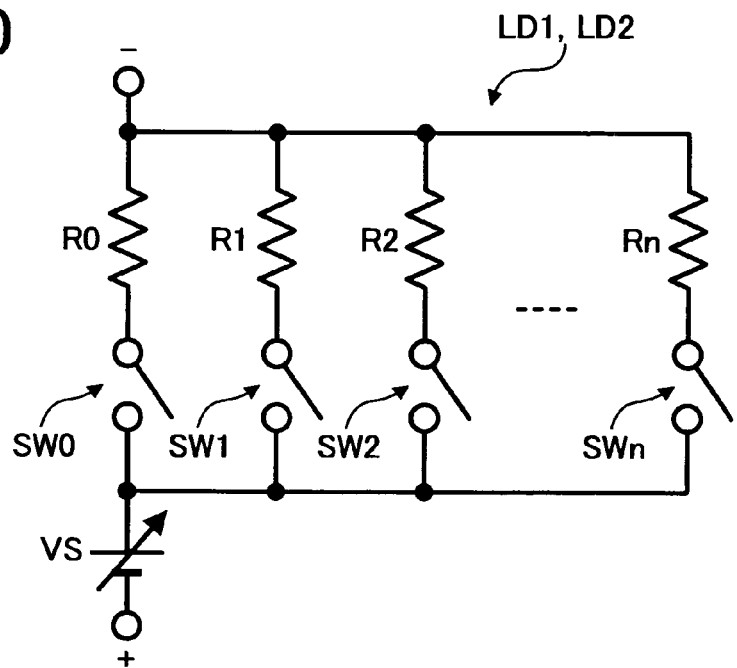
FIG. 10 is a schematic diagram illustrating a circuit configuration of any one of the first and second pseudo laser diodes of FIG. 3, according to another preferred embodiment.

Referring to FIG. 8, the other terminals of the switches SW0 to SWn are connected at the anode side. However, they may be arranged at the cathode side as illustrated in FIG. 10.

Figure 11:
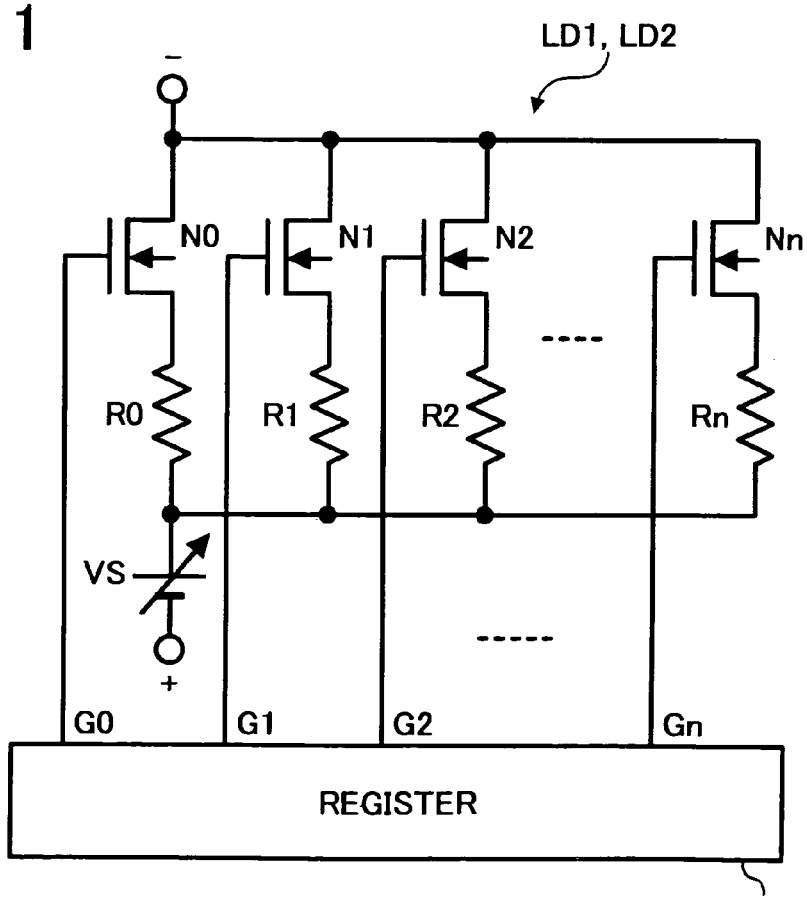
FIG. 11 is a schematic diagram illustrating a circuit configuration of any one of the first and second pseudo laser diodes of FIG. 3, according to another preferred embodiment.

Further, any one of the switches SW0 to SWn may be implemented as a MOS transistor, as illustrated in FIG. 11. In addition, the switches SW0 to SWn may be controlled by a programmable register 25, as illustrated in FIG. 11. Referring to FIG. 11, the gates of the NMOS transistors N0 to Nn are connected to the register 25. In order to turn on one or more of the transistors N0 to Nn, the register 25 is previously programmed to send corresponding one or more of high level signals G0 to Gn to the corresponding one or more of the gates.

Alternatively, any one of the switches SW0 to SWn may be implemented in other ways, including as a fuse, as long as the resistance of the pseudo laser diode can be controlled.

Figure 12:
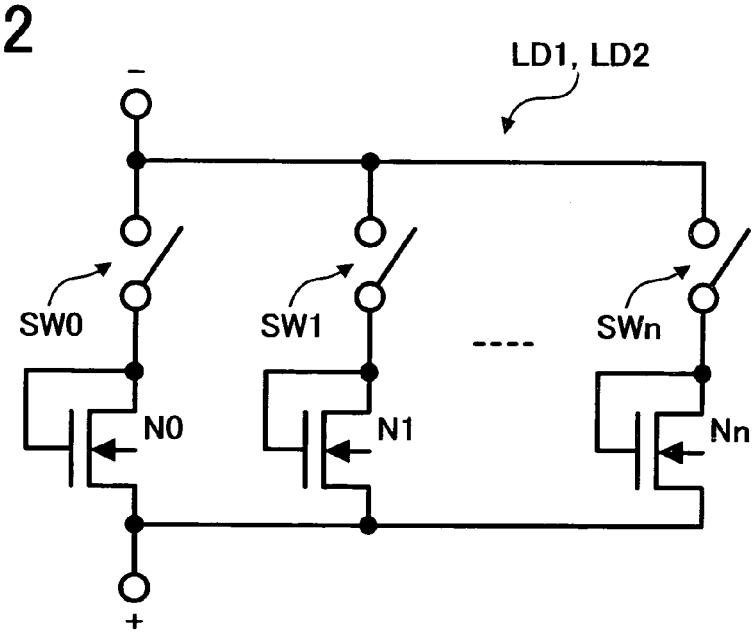
FIG. 12 is a schematic diagram illustrating a circuit configuration of any one of the first and second pseudo laser diodes of FIG. 3, according to another preferred embodiment.

In order to respond to variations in the characteristics of the laser diode LD, the pseudo laser diode may have a configuration illustrated in FIG. 12, according to another preferred embodiment.

The pseudo laser diode of FIG. 12 includes a plurality of switches SW0 to SWn connected in parallel to one another, and a plurality of NMOS transistors N0 to Nn connected in parallel to one another. The terminals of the switches SW0 to SWn are connected, respectively, to the NMOS transistors N0 to Nn. The other terminals of the switches SW0 to SWn are connected to one another at the anode of the pseudo laser diode. The characteristic of the pseudo laser diode may be controlled by turning on at least one of the switches SW0 to SWn.

Figure 13:
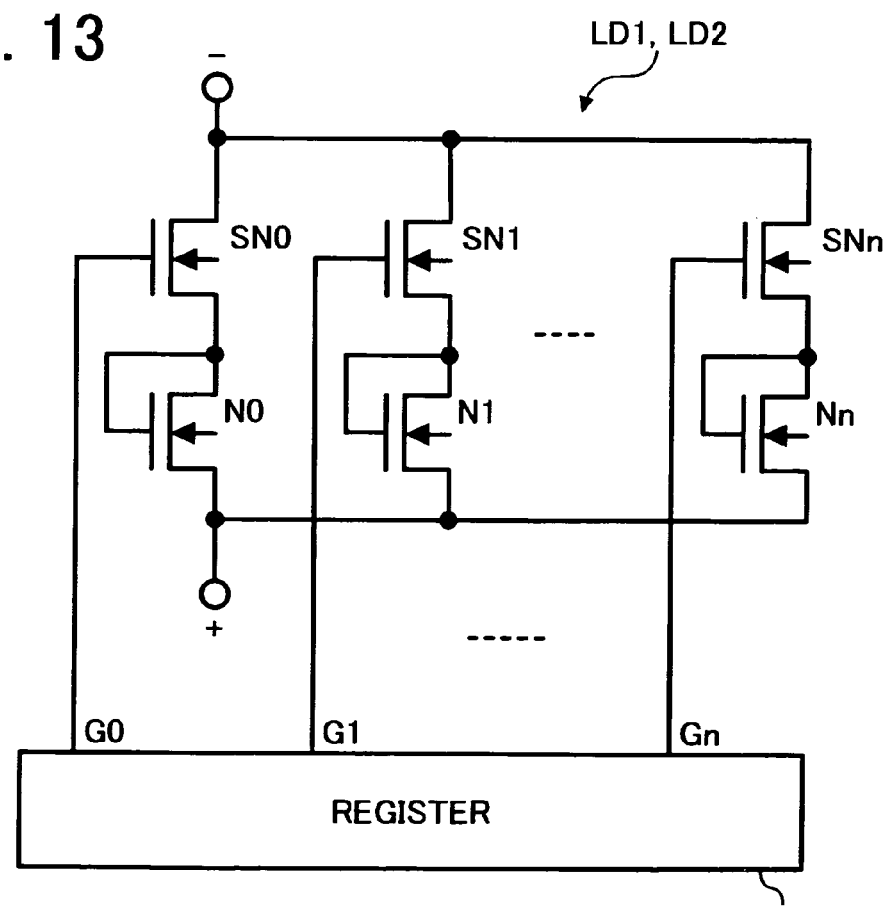
FIG. 13 is a schematic diagram illustrating a circuit configuration of any one of the first and second pseudo laser diodes of FIG. 3, according to another preferred embodiment.

In this exemplary case, any one of the switches SW0 to SWn may be implemented as an NMOS transistor, as illustrated in FIG. 13. Further, the switches SW0 to SWn may be controlled by the programmable register 25, as illustrated in FIG. 13. Referring to FIG. 13, the gates of the NMOS transistors SN0 to SNn are connected to the register 25. In order to turn on one or more of the transistors SN0 to SNn, the register 25 is programmed to send corresponding one or more of high level signals G0 to Gn to the corresponding one or more of the gates of the transistors SN0 to SNn.

Figure 14:
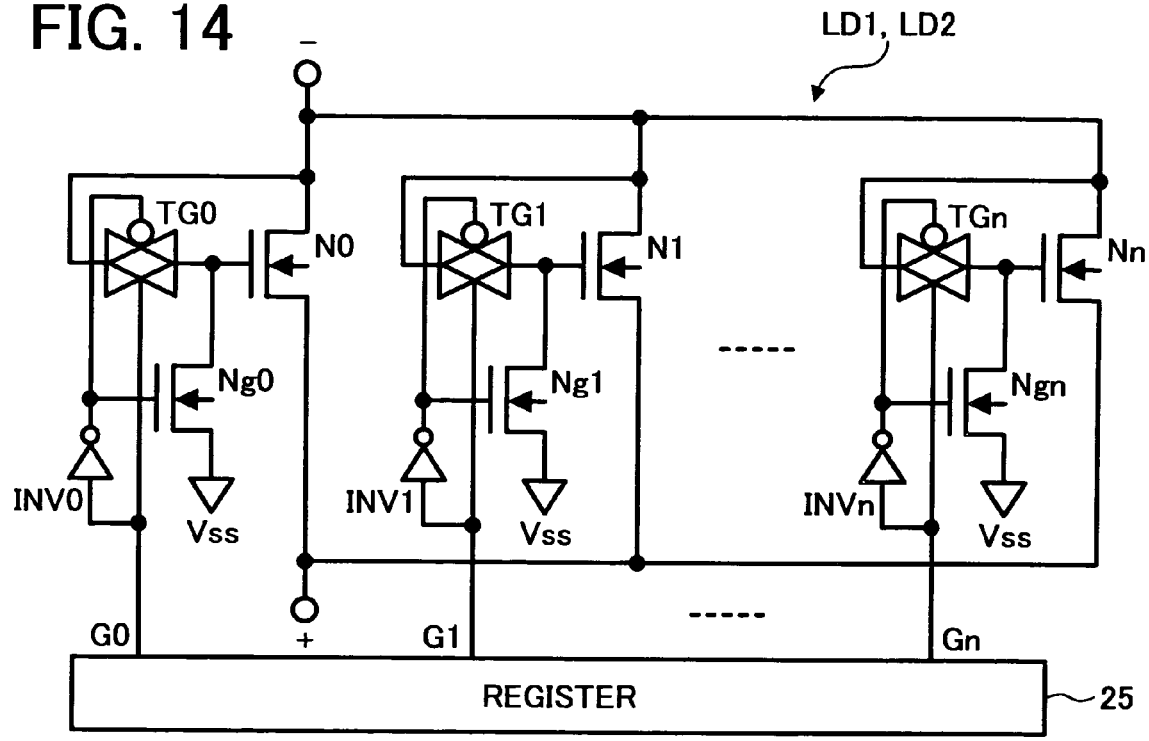
FIG. 14 is a schematic diagram illustrating a circuit configuration of any one of the first and second pseudo laser diodes of FIG. 3, according to another preferred embodiment.

Further, any one of the switches SW0 to SWn of FIG. 12 may be implemented as a transmission gate, as illustrated in FIG. 14. Referring to FIG. 14, the pseudo laser diode includes a plurality of NMOS transistors N0 to Nn and Ng0 to Ngn, a plurality of transmission gates TG0 to TGn, and a plurality of inverters INV0 to INVn. The drains of the NMOS transistors N0 to Nn are connected to one another at the anode side of the pseudo laser diode. The sources of the NMOS transistors N0 to Nn are connected to one another at the cathode side. The corresponding one of the transmission gates TG0 to TGn is connected between the gate and the drain of each of the NMOS transistors N0 to Nn.

When any one of the transmission gates TG0 to TGn is turned on, the gate and the drain of the corresponding one of the NMOS transistors N0 to Nn is connected to each other to function as a diode.

When any one of the transmission gates TG0 to TGn is turned off, and the corresponding one of the NMOS transistors Ng0 to Ngn is turned on, the corresponding one of the NMOS transistors N0 to Nn is connected to the negative voltage supply Vss, such as the ground. Accordingly, the corresponding one of the NMOS transistors N0 to Nn becomes isolated. In this way, the characteristic of the pseudo laser diode may be controlled, depending on the characteristic of the laser diode LD.

Figure 15:
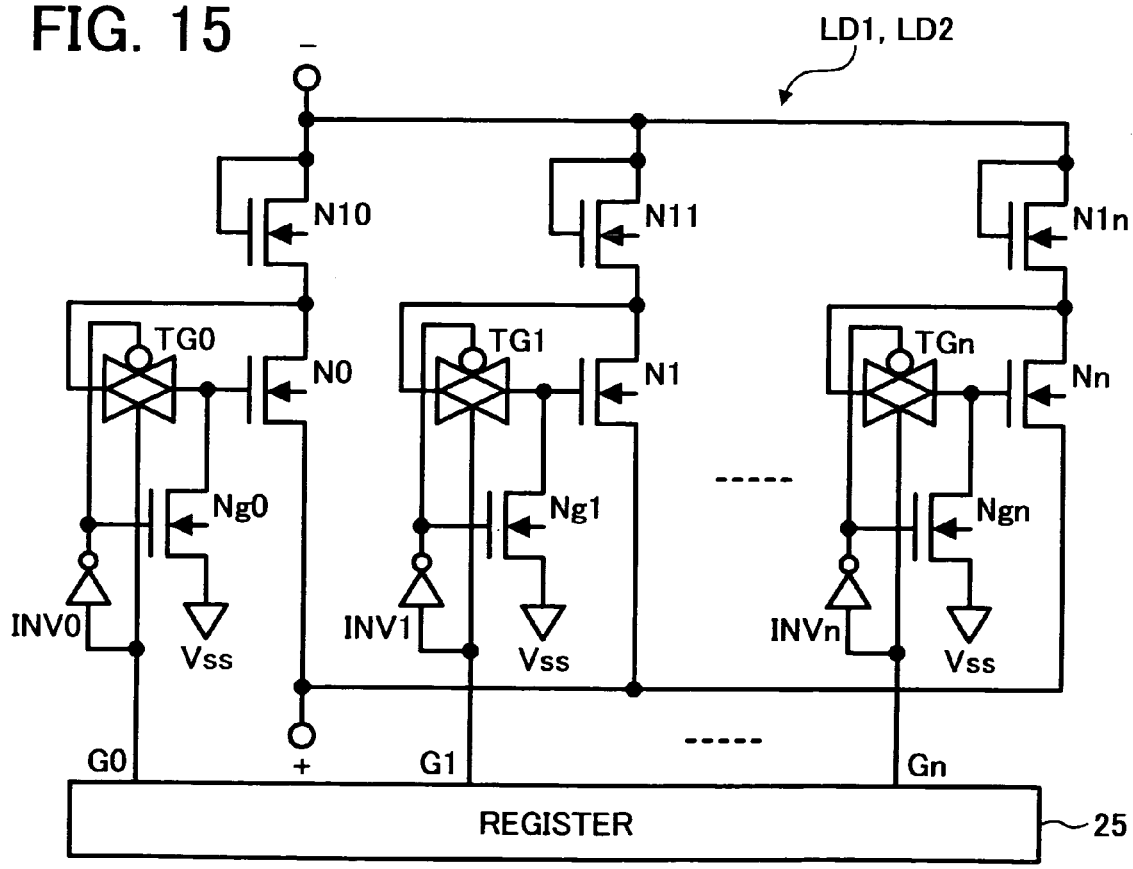
FIG. 15 is a schematic diagram illustrating a circuit configuration of any one of the first and second pseudo laser diodes of FIG. 3, according to another preferred embodiment.

When the forward voltage VF of the laser diode LD is larger than a predetermined value, another set of NMOS transistors N10 to N1n may be introduced, as illustrated in FIG. 15. In this exemplary case, instead of controlling the NMOS transistors N0 to Nn, the NMOS transistors N10 to N1n may be controlled to obtain a desired characteristic.

Figure 16:
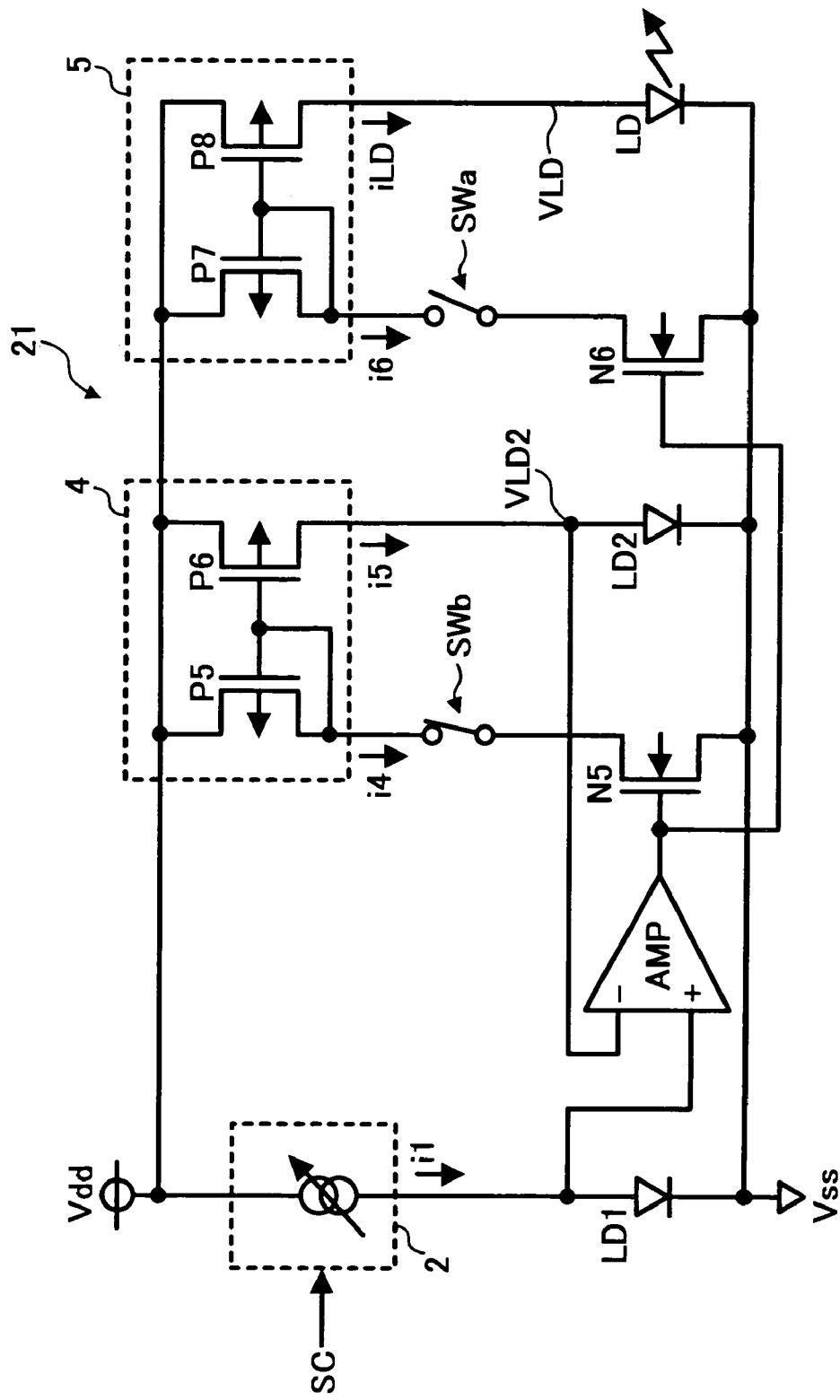
FIG. 16 is a schematic diagram illustrating a circuit configuration of a laser diode driving circuit according to another preferred embodiment.

Referring now to FIG. 16, a laser diode driving circuit 21 is explained according to another preferred embodiment.

The driving circuit 21, capable of driving the laser diode LD, includes the current supply 2, the first pseudo laser diode LD1, the second pseudo laser diode LD2, the second current mirror circuit 4, the third current mirror circuit 5, the amplifier AMP, the NMOS transistor N5, the NMOS transistor N6, the first switch SWa, and the second switch SWb. As shown in FIG. 16, the circuit 21 has a configuration less complex than the configuration of the circuit 1 of FIG. 3.

The amplifier AMP, which controls the gate voltage of the NMOS transistor N5, can adjust the current i5, to make the anode voltage VLD1 and the anode voltage VLD2 substantially equal to each other. Further, the amplifier, which controls the gate voltage of the NMOS transistor N6, can adjust the current i6, i.e. the current iLD, to be substantially proportional to the current i5. In this way, the current iLD is made substantially proportional to the current i1.

Figure 17:
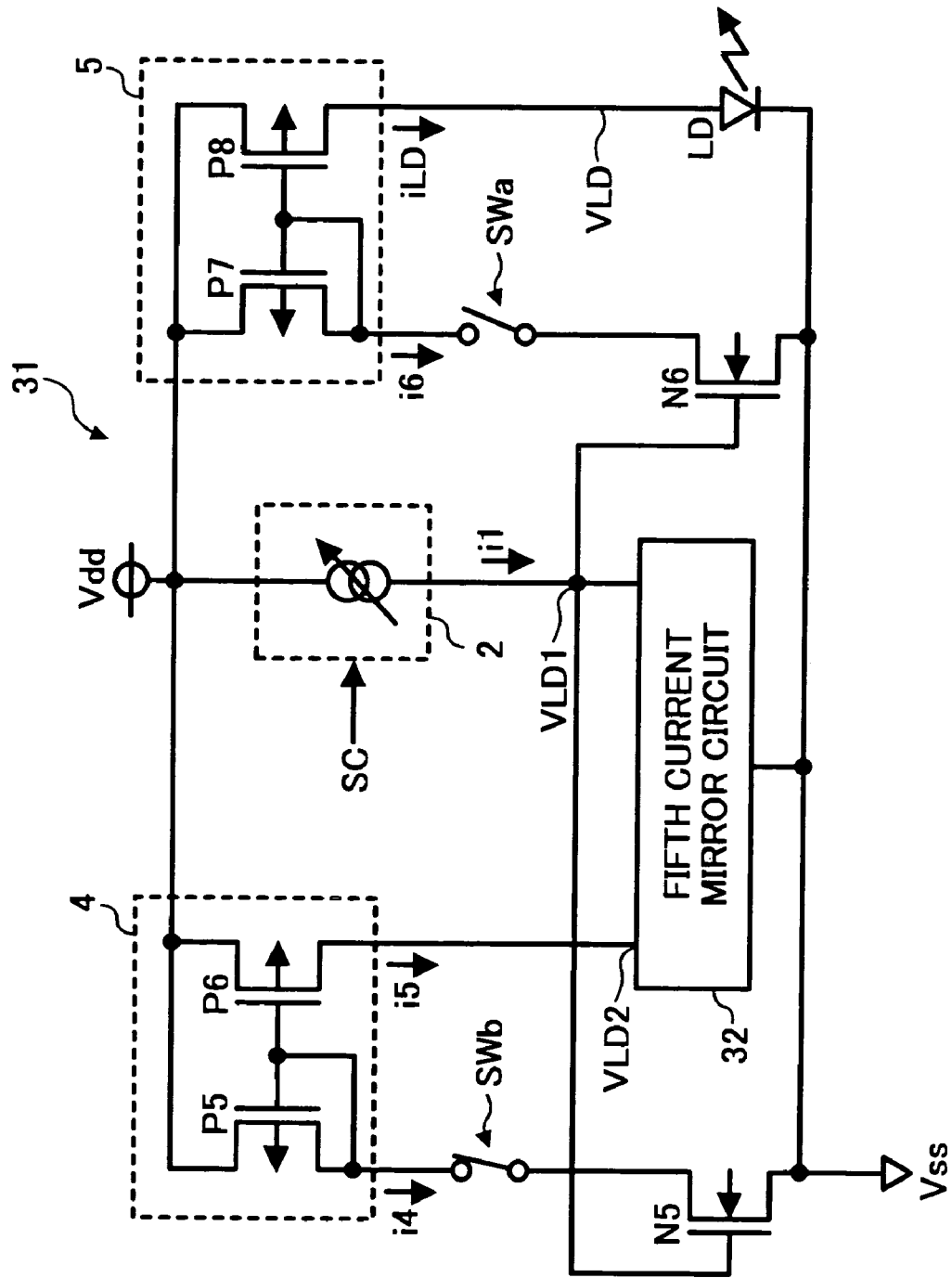
FIG. 17 is a schematic diagram illustrating a circuit configuration of a laser diode driving circuit according to another preferred embodiment.

Referring now to FIG. 17, a laser diode driving circuit 31 is explained according to another preferred embodiment.

The driving circuit 31, capable of driving the laser diode LD, includes the current supply 2, the second current mirror circuit 4, the third current mirror circuit 5, the NMOS transistor N5, the NMOS transistor N6, the first switch SWa, the second switch SWb, a fifth current mirror circuit 32. As shown in FIG. 17, the circuit 31 has a configuration less complex than the configuration of the circuit 21 of FIG. 16.

The current supply 2 is connected between the positive supply voltage Vdd and the output terminal of the fifth current mirror circuit 32. The connecting point between the current supply 2 and the fifth current mirror circuit 32 is further connected to the gates of the NMOS transistors N5 and N6, respectively.

The sources of the PMOS transistors P5 and P6 are each connected to the positive supply voltage Vdd. The PMOS transistor P5 has the gate connected to the gate of the PMOS transistor P6, and the drain connected to the connecting point between the PMOS transistors P5 and P6. The second switch SWb and the NMOS transistor N5 are serially connected between the drain of the PMOS transistor P5 and the negative supply voltage Vss.

The sources of the PMOS transistors P7 and P8 are each connected to the positive supply voltage Vdd. The PMOS transistor P7 has the gate connected to the gate of the PMOS transistor P8, and the drain connected to the connecting point between the PMOS transistors P7 and P8. The first switch SWa and the NMOS transistor N6 are serially connected between the drain of the PMOS transistor P7 and the negative supply voltage Vss.

Referring to FIG. 18, the fifth current mirror circuit 32 includes NMOS transistors N0 to Nn, Nb0 to Nbn, SN0 to SNn, and SNb0 to SNbn, and a register 25. Each one of the NMOS transistors SNb0 to SNbn and the corresponding one of the NMOS transistors Nb0 to Nb1 are serially connected to each other between the current supply 2 and the negative supply voltage Vss. Each one of the NMOS transistors SN0 to SNn and the corresponding one of the NMOS transistors N0 to Nn are serially connected to each other between the drain of the PMOS transistor P6 and the negative supply voltage Vss.

Each of the gates of the NMOS transistors SN0 to SNn is connected to the corresponding one of the gates of the NMOS transistors SNb0 to SNbn. Each of the connecting points of the NMOS transistors SN0 to SNn and the NMOS transistors SNb0 to SNbn is further connected to the register 25. Each of the gates of the NMOS transistors N0 to Nn is connected to the corresponding one of the gates of the NMOS transistors Nb0 to Nbn. Each of the connecting points of the NMOS transistors N0 to Nn and the NMOS transistors Nb0 to Nbn is further connected to the corresponding one of the connecting points of the NMOS transistors N0 to Nn and the NMOS transistors SN0 to SNn.

Each of the NMOS transistors Nb0 to Nbn functions as the first pseudo laser diode LD1 shown in any one of FIGS. 3 and 16. Each of the NMOS transistors N0 to Nn functions as the second pseudo laser diode LD2 shown in any one of FIGS. 3 and 16.

The register 25 is previously programmed to send a high level signal to at least one of the NMOS transistors SN0 to SNn to turn on the corresponding one of the NMOS transistors N0 to Nn. Similarly, the register 25 sends a high level signal to at least one of the NMOS transistors SNb0 to SNbn to turn on the corresponding one of the NMOS transistors Nb0 to Nbn.

For example, when the register 25 sends a high level signal to the NMOS transistor SNk and the NMOS transistor SNbk, with k being an integer between 0 and n, the current i1, supplied by the current supply 2, is input to the drain of the NMOS transistor Nbk as a drain current. The drain voltage of the NMOS transistor Nbk is output as the anode voltage VLD1 as illustrated in FIG. 17. The voltage VLD1 is further input to the gate of the NMOS transistor N5, which is connected to the second current mirror circuit 4. As a result, the current i4, i.e. the current i5, is made substantially equal to the current i1.

Still referring to FIG. 17, the voltage VLD1 is further input to the gate of the NMOS transistor N6, which is connected to the third current mirror circuit 5. Thus, the current i6 becomes substantially proportional to the current i4. Since the circuit 4 and the circuit 5 are substantially similar in circuit configuration, the current iLD becomes substantially proportional to the current i1.

The fifth current mirror circuit 32 may have a configuration other than the configuration of FIG. 18. For example, the fifth current mirror circuit 32 may include any kind of circuits, capable of compensating the channel length modulation effect. For example, a cascade current mirror circuit shown in FIG. 19 may preferably be used. Alternatively, the channel length modulation effect may be suppressed by controlling the gate channel length of any one of the NMOS transistors of the circuit 32.

Figure 20:
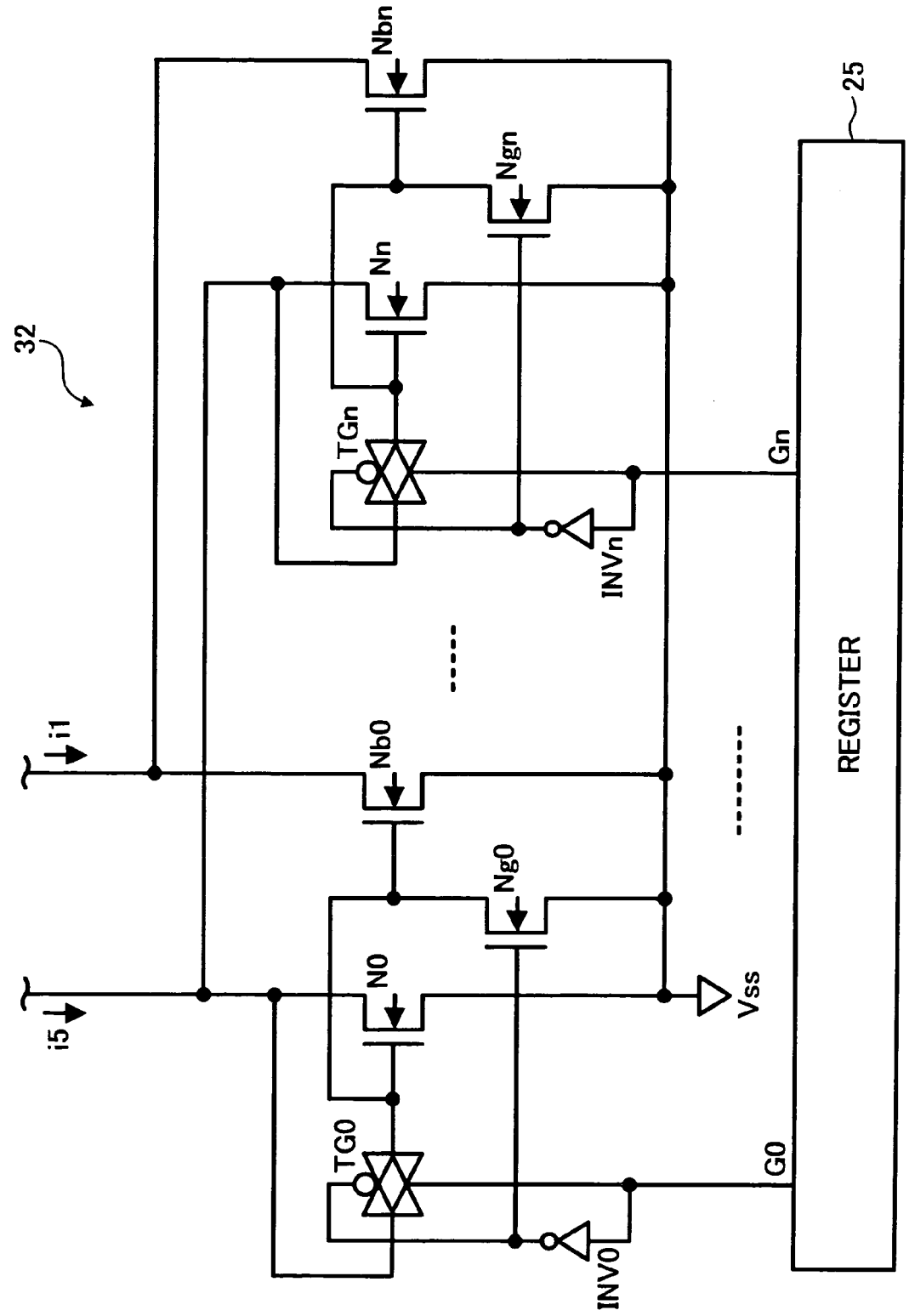
FIG. 20 is a schematic diagram illustrating the fifth current mirror circuit of FIG. 17, according to another preferred embodiment.

In another example, referring to FIG. 20, the fifth current mirror circuit 32 may include a plurality of NMOS transistors N0 to Nn, Nb0 to Nbn, and Ng0 to Ngn, a plurality of transmission gates TG0 to TGn, and a plurality of inverters INV0 to INVn. The drains of the NMOS transistors Nb0 to Nbn are connected to one another. The sources of the NMOS transistors Nb0 to Nbn are connected to one another, and further to the negative supply voltage Vss. The drains of the NMOS transistors N0 to Nn are connected to one another. The sources of the NMOS transistors N0 to Nn are connected to one another, and further to the negative supply voltage Vss. The corresponding one of the transmission gates TG0 to TGn is connected between the gate and the drain of each of the NMOS transistors N0 to Nn.

Figure 21:
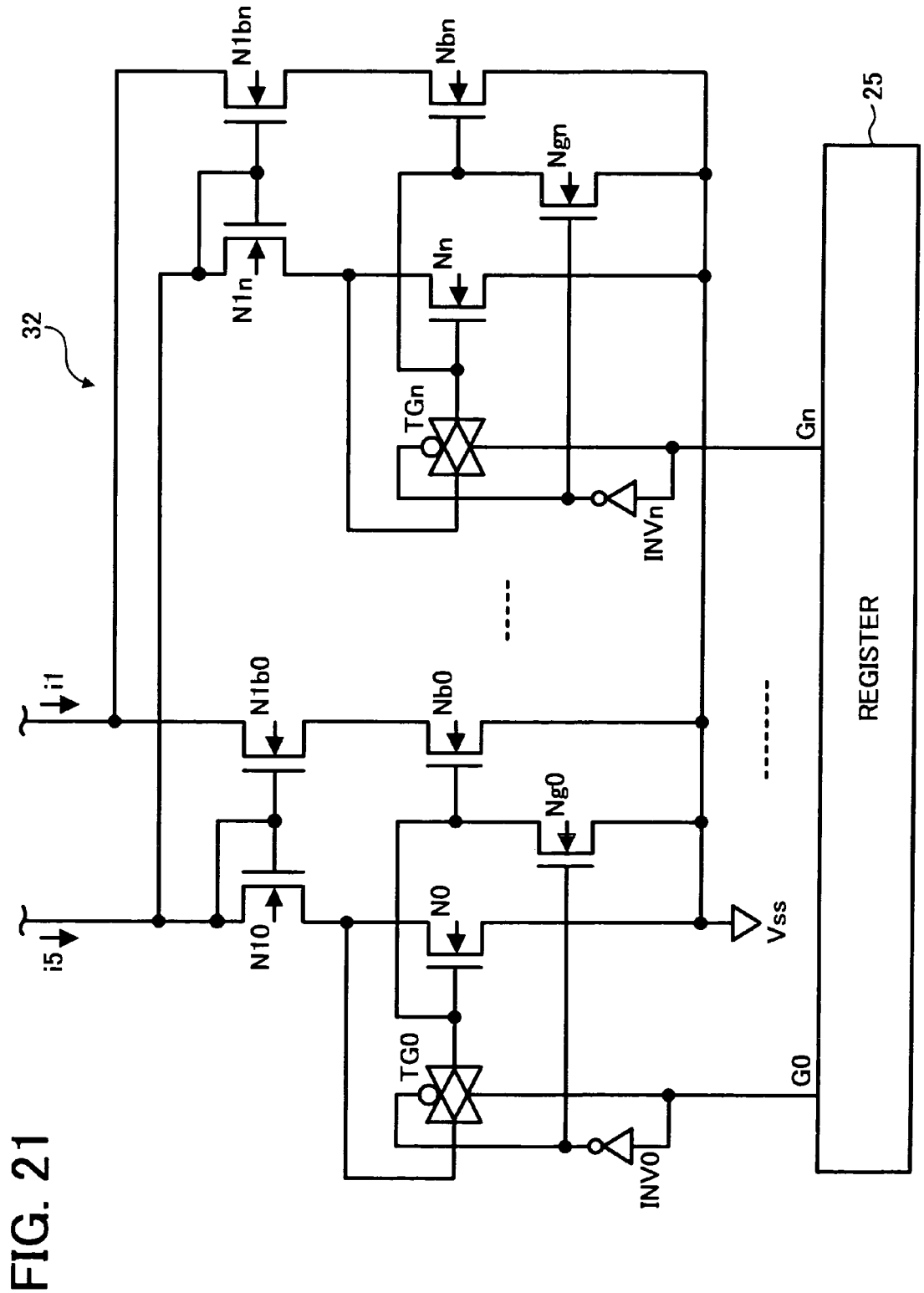
FIG. 21 is a schematic diagram illustrating the fifth current mirror circuit of FIG. 17, according to another preferred embodiment.

Further, when the forward voltage VF of the laser diode LD is larger than a predetermined value, another set of NMOS transistors N10 to N1n may be introduced, as illustrated in FIG. 21, for example.

Any one of the above-described laser diode driving circuits and other light source driving circuits according to the present disclosure may be incorporated in any kind of light emitting system. For example, a light emitting system may include a controller, which outputs a control signal. Based on the control signal, the light source driving circuit of the present disclosure generates an input current, and further generates an output current equal to or proportional to the input current.

Numerous additional modifications and variations are possible in light of the above teachings. It is therefore to be understood that within the scope of the appended claims, the disclosure of this patent specification may be practiced otherwise than as specifically described herein. For example, elements and/or features of different illustrative embodiments may be combined with each other and/or substituted for each other within the scope of this disclosure and/or appended claims.

Further, the invention of this disclosure and/or appended claims may be implemented using one or more conventional general purpose microprocessors and/or signal processors programmed according to the teachings of the present disclosure, as will be appreciated by those skilled in the relevant art(s). Appropriate software coding can readily be prepared by skilled programmers based on the teachings of the present disclosure, as will also be apparent to those skilled in the relevant art(s). Alternatively, as described above, the invention of this disclosure and/or appended claims may be implemented by ASIC, prepared by interconnecting an appropriate network of conventional component circuits or by a combination thereof with one or more conventional general purpose microprocessors and/or signal processors programmed accordingly.

This patent specification claims priority to Japanese patent application No. JPAP2004-058970 filed on Mar. 3, 2004, in the Japanese Patent Office, the entire contents of which are hereby incorporated by reference.

What is claimed is:

1. A laser diode driving circuit for driving a laser diode, comprising:
   a current supply configured to input a predetermined input current;
   a first pseudo laser diode having a characteristic substantially equal to a characteristic of the laser diode, configured to receive a first current being substantially equal or proportional to the input current;
   a second pseudo laser diode having a characteristic substantially equal to the characteristic of the laser diode, configured to receive a second current substantially equal to the first drain current; and
   an output current mirror circuit configured to provide an output current to the laser diode, with the output current being substantially equal or proportional to at least one of the first current and the second current.

2. The laser diode driving circuit of claim 1, further comprising:
   a second pseudo current mirror circuit coupled to the second pseudo laser diode and configured to provide the second circuit to the second pseudo laser diode; and
   a compensating circuit configured to provide a third current to the second pseudo current mirror circuit, with the third current being equal to the first current.

3. The laser diode driving circuit of claim 2, further comprising:
   a first pseudo current mirror circuit coupled to the first pseudo laser diode and configured to generate the first current based on the input current.

4. The laser diode driving circuit of claim 3, wherein the channel width modulation effect is reduced in the first pseudo current mirror circuit.

5. The laser diode driving circuit of claim 3, further comprising:
   an input current mirror circuit configured to provide a current generated based on the input current to at least one of the first pseudo current mirror circuit, the second pseudo current mirror circuit, and the output current mirror circuit.

6. The laser diode driving circuit of claim 5, wherein the input current mirror circuit includes:
   a first transistor configured to generate a fourth current proportional to the input current; and a second transistor having a transistor size smaller than a transistor size of the first transistor, configured to generate a fifth current smaller than the fourth current, with the fifth current being convened to the third current by the compensating circuit.

7. The laser diode driving circuit of claim 2, wherein the compensating circuit is configured to provide a sixth current to the output current mirror circuit, with the sixth current being equal or proportional to the second current.

8. The laser diode driving circuit of claim 2, further comprising:
a first switch configured to turn on or off the laser diode; and
a second switch having a second impedance adjusted based on a first impedance of the first switch.

9. The laser diode driving circuit of claim 8, wherein the ratio between the first impedance and the second impedance corresponds to the ratio between a current consumption of the second pseudo current mirror circuit and a current consumption of the output current mirror circuit.

10. The laser diode driving circuit of claim 2, wherein the ratio between the characteristic of the second pseudo laser diode and the characteristic of the laser diode corresponds to the ratio between a current consumption of the second pseudo current mirror circuit and a current consumption of the output current mirror circuit.

11. The laser diode driving circuit of claim 1, wherein the characteristic of each of the first and second pseudo laser diodes is determined based on at least one of a forward voltage and a resistance of the laser diode.

12. The laser diode driving circuit of claim 1, wherein at least one of the first and second pseudo laser diodes includes:
a voltage supply configured to output a supply voltage determined based on the characteristic of the laser diode; and
a resistor connected serially to the voltage supply.

13. The laser diode driving circuit of claim 12, wherein the voltage supply includes:
an amplifier having an output terminal, a positive input terminal and a negative input terminal;
a transistor having a gate coupled to the output terminal; and
a converter configured to output a voltage, determined based on the characteristic of the laser diode, to the positive input terminal.

14. The laser diode driving circuit of claim 1, wherein at least one of the first and second pseudo laser diodes includes:
a voltage supply configured to output a supply voltage; and
a resistor connected serially to the voltage supply, configured to generate a resistance determined based on the characteristic of the laser diode.

15. The laser diode driving circuit of claim 1, wherein at least one of the first and second pseudo laser diodes includes:
a voltage supply configured to output a supply voltage determined based on the characteristic of the laser diode; and
a resistor connected serially to the voltage supply, configured to generate a resistance determined based on the characteristic of the laser diode.

16. The laser diode driving circuit of claim 14, wherein the resistor includes:
a resistor section, having a plurality of resistor circuits connected in parallel to one another, with each resistor circuit having a predetermined resistance; and
a switch section, having a plurality of switch circuits connected in parallel to one another, configured to control the resistor section to have the resistance determined based on the characteristic of the laser diode.

17. The laser diode driving circuit of claim 16, wherein each of the plurality of resistor circuits is connected in series to the corresponding one of the plurality of switch circuits.

18. The laser diode driving circuit of claim 16, wherein the switch circuit includes a transistor circuit.

19. The laser diode driving circuit of claim 16, wherein the resistor circuit includes a transistor circuit.

20. The laser diode driving circuit of claim 18, wherein the resistor circuit includes a transistor circuit.

21. The laser diode driving circuit of claim 16, further comprising:
a register coupled to the switch section and configured to turn on a selected one of the switch circuits.

22. The laser diode driving circuit of claim 14, wherein the resistance is adjusted by fuse trimming.

23. The laser diode diving circuit of claim 15, wherein the resistance is adjusted by fuse trimming.

24. The laser diode driving circuit of claim 1, wherein at least one of the first and second pseudo laser diodes includes:
a diode section, having a plurality of diode circuits connected in parallel to one another, configured to generate a desired characteristic determined based on the characteristic of the laser diode; and
a switch section, having a plurality of switch circuits connected in parallel to one another, configured to control the diode section to have the characteristic determined based on the characteristic of the laser diode.

25. The laser diode driving circuit of claim 24, wherein at least one of a gate length and a gate width of the diode circuit is adjusted to have the desired characteristic.

26. The laser diode driving circuit of claim 24, wherein each of the plurality of diode circuits is connected in series to the corresponding one of the plurality of switch circuits.

27. The laser diode driving circuit of claim 24, wherein the switch circuit includes a transistor circuit.

28. The laser diode driving circuit of claim 24, further comprising:
a register coupled to the switch section and configured to turn on a selected one of the switch circuits.

29. The laser diode driving circuit of claim 24, wherein each of the plurality of diode circuits is connected in parallel to the corresponding one of the plurality of switch circuits.

30. The laser diode driving circuit of claim 24, wherein the plurality of diode circuits includes at least two diode circuits serially connected to each other.

31. The laser diode driving circuit of claim 24, wherein the switch circuit includes a fuse.

32. The laser diode driving circuit of claim 1, wherein the first pseudo laser diode and the second pseudo laser diode form a current mirror circuit configuration.

33. The laser diode diving circuit of claim 32, wherein the current mirror circuit configuration includes a cascade current mirror configuration.

34. The laser diode driving circuit of claim 32, wherein at least one of the first and second pseudo laser diodes includes:

a diode section, having a plurality of diode circuits connected in parallel to one another, configured to generate a characteristic determined based on the characteristic of the laser diode; and a switch section, having a plurality of switch circuits connected in parallel to one another, configured to control the diode section to have the characteristic determined based on the characteristic of the laser diode.

35. The laser diode driving circuit of claim 34, wherein at least one of a gate length and a gate width of the diode circuit is adjusted to have the desired characteristic.

36. The laser diode driving circuit of claim 34, wherein each of the plurality of diode circuits is connected in series to the corresponding one of the plurality of switch circuits.

37. The laser diode driving circuit of claim 34, further comprising:

a register coupled to the switch section and configured to turn on a selected one of the switch circuits.

38. The loser diode driving circuit of claim 34, wherein each of the plurality of diode circuits is connected in parallel to the corresponding one of the plurality of switch circuits.

39. The laser diode driving circuit of claim 34, wherein each of the plurality of diode circuits is connected in parallel to the corresponding one of the plurality of switch circuits.

40. The laser diode driving circuit of claim 34, wherein the plurality of diode circuits includes at least two diode circuits serially connected to each other.

41. The laser diode driving circuit of claim 34, wherein the switch circuit includes a fuse.

42. A light emitting system, comprising:

a laser diode having a predetermined characteristic, configured to generate a light according to an output current;

a controller configured to generate a control signal; and a storage device configured to store a plurality of instructions which, when activated by the controller, cause the controller to perform a current generating operation, including:

providing a predetermined input current based on the control signal;

providing a first current equal or proportional to the input current to a first pseudo laser diode;

providing a second current equal to the first current to a second pseudo laser diode; and providing the output current equal or proportional to the second current to the laser diode.

43. The system of claim 42, wherein each of the first pseudo laser diode and the second pseudo laser diode has a characteristic substantially equal to the predetermined characteristic of the laser diode.

* * * * *